United States Patent
Ma et al.

(10) Patent No.: US 11,736,116 B2
(45) Date of Patent: Aug. 22, 2023

(54) INTERDIGITAL CAPACITOR AND MULTIPLYING DIGITAL-TO-ANALOG CONVERSION CIRCUIT

(71) Applicant: Huawei Technologies Co., Ltd., Shenzhen (CN)

(72) Inventors: Chunyuan Ma, Shanghai (CN); Bingxin Li, Kista (SE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 57 days.

(21) Appl. No.: 17/564,437

(22) Filed: Dec. 29, 2021

(65) Prior Publication Data

US 2022/0123762 A1 Apr. 21, 2022

Related U.S. Application Data

(63) Continuation of application No. PCT/CN2019/094009, filed on Jun. 29, 2019.

(51) Int. Cl.
*H03M 1/66* (2006.01)
*H03M 1/80* (2006.01)
*H01L 23/522* (2006.01)
*H01L 49/02* (2006.01)

(52) U.S. Cl.
CPC .......... *H03M 1/66* (2013.01); *H01L 23/5223* (2013.01); *H01L 28/86* (2013.01); *H03M 1/802* (2013.01)

(58) Field of Classification Search
CPC ......... H03M 1/66; H03M 1/802; H01L 28/86; H01L 23/5223

USPC ......................................................... 341/144
See application file for complete search history.

(56) References Cited

U.S. PATENT DOCUMENTS

| | | | |
|---|---|---|---|
| 6,819,542 B2 * | 11/2004 | Tsai | H01L 23/5223 361/306.3 |
| 10,431,540 B1 * | 10/2019 | Cheng | H01L 23/5223 |
| 2002/0149084 A1 | 10/2002 | Tamaki et al. | |
| 2005/0145987 A1 | 7/2005 | Okuda et al. | |
| 2006/0237819 A1 | 10/2006 | Kikuta et al. | |
| 2013/0113077 A1 | 5/2013 | Woo et al. | |

FOREIGN PATENT DOCUMENTS

| | | |
|---|---|---|
| CN | 104753498 A | 7/2015 |
| CN | 205566241 U | 9/2016 |
| CN | 109473367 A | 3/2019 |

* cited by examiner

*Primary Examiner* — Khai M Nguyen
(74) *Attorney, Agent, or Firm* — Conley Rose, P.C.

(57) ABSTRACT

An interdigital capacitor and a multiplying digital-to-analog conversion circuit, where the interdigital capacitor includes at least one first metal layer. The following components are disposed in each first metal layer: a first electrode; at least one first finger metal connected to the first electrode; a second electrode; and a plurality of second finger metals connected to the second electrode, and at least one third finger metal connected to the second electrode. The at least one first finger metal is alternately disposed with the plurality of second finger metals to form capacitors, and the at least one third finger metal is a dummy finger metal.

20 Claims, 12 Drawing Sheets

Quantity of finger metals is 12     Quantity of finger metals is 24

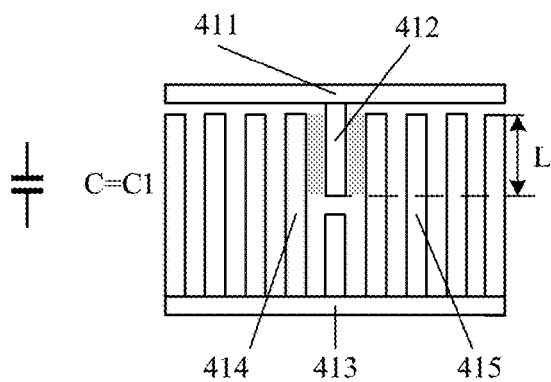
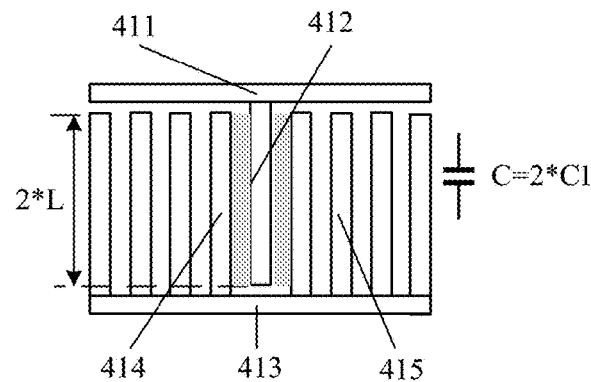
FIG. 6A        FIG. 6B
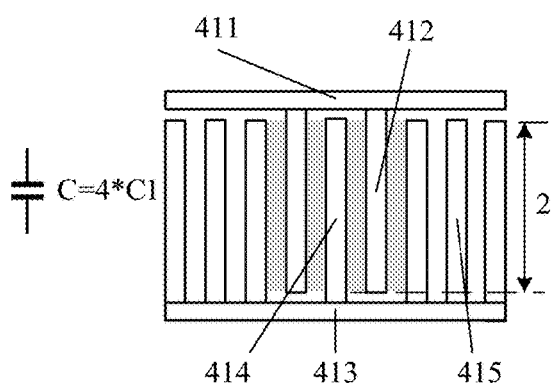
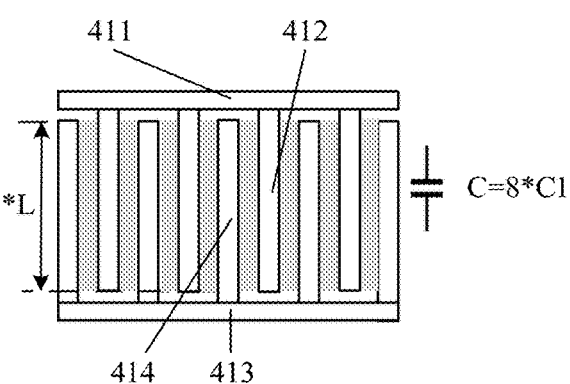
FIG. 6C        FIG. 6D

INTERDIGITAL CAPACITOR AND MULTIPLYING DIGITAL-TO-ANALOG CONVERSION CIRCUIT

CROSS-REFERENCE TO RELATED APPLICATIONS

This is a continuation of International Patent Application No. PCT/CN2019/094009, filed on Jun. 29, 2019, which is hereby incorporated by reference in its entirety.

TECHNICAL FIELD

This application relates to the field of circuit technologies, and in particular, to an interdigital capacitor and a multiplying digital-to-analog conversion circuit.

BACKGROUND

With rapid development of digital electronic technologies, various digital devices, especially a digital electronic computer, are widely used in various fields of national economy, such as industrial control and communication. The digital device can process only a digital signal. Therefore, an analog signal (for example, a temperature or pressure) can be processed by the digital device only by being converted into a digital signal using an analog-to-digital converter (ADC).

An ADC that is based on a binary weighted capacitor network (for example, a pipeline ADC, or a charge redistribution successive approximation register (SAR) ADC) is characterized by low costs and ease of integration, and is widely used in digital devices. Capacitor precision has great impact on performance of the ADC that is based on a capacitor array.

For example, a multiplying digital-to-analog converter (MDAC) is a key circuit in a pipeline ADC, and improvement of performance of the MDAC is one of keys to improve overall performance of the pipeline ADC. As shown in FIG. 1, the MDAC uses a capacitor charge transfer closed-loop structure and a sampling capacitor array. $C_i$ is a sampling capacitor, $C_f$ is a closed-loop feedback capacitor, $D_i = \pm 1$ and is determined by output of a sub-ADC in the pipeline ADC, $\Phi_1$ and $\Phi_2$ are switches controlled using sample-and-hold control clock signals, and $V_{ref}$ is a reference voltage of the sub-ADC. Assuming that a gain of an operational amplifier A is infinite, the following transfer function of the MDAC may be obtained according to a charge conservation principle:

$$V_0 = \frac{C_s}{C_f} * V_{in} - V_{ref} * \sum_{i=1}^{n} D_i * \frac{C_i}{C_f} = \frac{C_s}{C_f}\left(V_{in} - V_{ref} * \sum_{i=1}^{n} D_i * W_i\right),$$

where $$C_s = \sum_{j=1}^{n} C_j,$$

$$W_i = \frac{C_j}{\sum_{j=1}^{n} C_j},$$

$C_s$ is a total sampling capacitance, and $W_i$ is a weight of each unit sampling capacitance. It may be learned from the foregoing formula that sampling capacitor mismatch causes a linear gain ($C_s/C_f$) error and an analog-to-digital conversion ADC error in the transfer function, and consequently the pipeline ADC finally outputs a nonlinear quantization result.

People have an increasingly high requirement for precision of the ADC that is based on a binary weighted capacitor network, and only a metal-oxide-metal (MOM) capacitor in existing capacitor types can be manufactured to achieve a relatively small capacitance value and relatively low costs. Therefore, to improve the precision of the ADC that is based on a binary weighted capacitor network, a high-precision MOM capacitor urgently needs to be proposed.

SUMMARY

This application provides an interdigital capacitor and a multiplying digital-to-analog conversion circuit, to reduce a mismatch rate of the interdigital capacitor and improve precision of the interdigital capacitor.

According to a first aspect, this application provides an interdigital capacitor. The interdigital capacitor includes at least one first metal layer. The following components are disposed in each first metal layer: a first electrode; at least one first finger metal connected to the first electrode; a second electrode; and a plurality of second finger metals connected to the second electrode, and at least one third finger metal connected to the second electrode. The at least one first finger metal is alternately disposed with the plurality of second finger metals to form capacitors, and the at least one third finger metal is a dummy finger metal, that is, the at least one third finger metal does not form a capacitor with any one of the at least one first finger metal and the plurality of second finger metals.

According to the foregoing solution, because one or more dummy finger metals (third finger metals) exist in the first metal layer of the interdigital capacitor, when a layout area of the interdigital capacitor is specific, a capacitance value of the interdigital capacitor may be flexibly changed by adjusting parameters such as a quantity of first finger metals, a quantity of second finger metals, a quantity of third finger metals, a length of the first finger metal, and a length of the second finger metal. In addition, because the one or more dummy finger metals exist in the first metal layer of the interdigital capacitor, interdigital capacitors with different capacitance values may have a same layout size. This facilitates layout deployment and proper area utilization of a circuit in which the interdigital capacitors are located, and helps reduce a process deviation between interdigital capacitors with different capacitance values.

In a possible implementation, first metal electrodes in two adjacent first metal layers are connected to each other using a first conductive channel, and second metal electrodes in the two adjacent first metal layers are connected to each other using a second conductive channel. The first conductive channel and the second conductive channel may be through holes filled with a metal (such as metal tungsten) in a dielectric layer between the two adjacent first metal layers.

In a possible implementation, all the at least one third finger metal is located on a same side of the plurality of second finger metals. Alternatively, when the first metal layer includes a plurality of third finger metals, the plurality of third finger metals are located on two sides of the plurality of second finger metals.

In a possible implementation, when the first metal layer includes a plurality of first finger metals, the plurality of first finger metals have different lengths.

In a possible implementation, the plurality of second finger metals have different lengths.

In a possible implementation, for any first metal layer in the interdigital capacitor, a quantity of first finger metals, a quantity of second finger metals, an effective length of the first finger metal, and a distance between the first finger metal and the second finger metal that are adjacent to each other are set based on a capacitance value of a capacitor of the first metal layer. The effective length of the first finger metal is a length of a part that is of the first finger metal and that can form a sidewall capacitor with a neighboring second finger metal, the capacitance value of the capacitor of the first metal layer is positively correlated with the quantity of first finger metals, the quantity of second finger metals, and the effective length of the first finger metal, and the capacitance value of the capacitor of the first metal layer is negatively correlated with the distance between the first finger metal and the second finger metal that are adjacent to each other.

In a possible implementation, a distance between two adjacent finger metals in the first metal layer is greater than or equal to a first threshold, and a width of each finger metal in the first metal layer is greater than or equal to a second threshold. When the distance between two adjacent finger metals in the first metal layer is greater than or equal to the first threshold, and the width of each finger metal in the first metal layer is greater than or equal to the second threshold, the interdigital capacitor can be horizontally placed, and can also be vertically placed.

In a possible implementation, the distance between two adjacent finger metals in the first metal layer may be greater than or equal to 0.08 micrometers ($\mu m$), and the width of each finger metal in the first metal layer may be greater than or equal to 0.08 $\mu m$.

In a possible implementation, the interdigital capacitor further includes a second metal layer disposed above the at least one first metal layer, and the second metal layer is configured to shield interference caused by an external environment for the at least one first metal layer.

In a possible implementation, the second metal layer includes a third electrode and a plurality of fourth finger metals separately connected to the third electrode. The third electrode is electrically connected, using a third conductive channel, to a first electrode in a first metal layer adjacent to the second metal layer, or the third electrode is electrically connected, using a third conductive channel, to a second electrode in a first metal layer adjacent to the second metal layer. The third conductive channel may be a through hole filled with a metal (such as metal tungsten) in a dielectric layer between the second metal layer and the first metal layer adjacent to the second metal layer.

Further, the second metal layer may further include a fifth electrode. When the third electrode is electrically connected, using the third conductive channel, to the first electrode in the first metal layer adjacent to the second metal layer, the fifth electrode is electrically connected, using a fifth conductive channel, to a second electrode in the first metal layer adjacent to the second metal layer. Alternatively, when the third electrode is electrically connected, using the third conductive channel, to the second electrode in the first metal layer adjacent to the second metal layer, the fifth electrode is electrically connected, using a fifth conductive channel, to a first electrode in the first metal layer adjacent to the second metal layer.

In a possible implementation, the interdigital capacitor may further include a third metal layer disposed below the at least one first metal layer, and the third metal layer is configured to shield interference caused by an external environment for the at least one first metal layer.

In a possible implementation, the third metal layer includes a fourth electrode and a plurality of fifth finger metals separately connected to the fourth electrode. The fourth electrode is electrically coupled, using a fourth conductive channel, to a first electrode in a first metal layer adjacent to the third metal layer, or the fourth electrode is electrically connected, using a fourth conductive channel, to a second electrode in a first metal layer adjacent to the third metal layer. The fourth conductive channel may be a through hole filled with a metal (such as metal tungsten) in a dielectric layer between the third metal layer and the first metal layer adjacent to the third metal layer.

Further, the third metal layer may further include a sixth electrode. When the fourth electrode is electrically coupled, using the fourth conductive channel, to the first electrode in the first metal layer adjacent to the third metal layer, the sixth electrode is electrically connected, using a sixth conductive channel, to a second electrode in the first metal layer adjacent to the third metal layer. Alternatively, when the fourth electrode is electrically coupled, using the fourth conductive channel, to the second electrode in the first metal layer adjacent to the third metal layer, the sixth electrode is electrically connected, using a sixth conductive channel, to a first electrode in the first metal layer adjacent to the third metal layer.

In a possible implementation, to meet a requirement of a machining process for a metal density in the interdigital capacitor, the interdigital capacitor further includes at least one fourth metal layer, and the fourth metal layer is configured to perform density filling, that is configured to increase a metal density of a layer in which the fourth metal layer is located in the interdigital capacitor. The at least one fourth metal layer is disposed at the top of the interdigital capacitor, that is, all fourth metal layers are disposed on the top of the interdigital capacitor; the at least one fourth metal layer is disposed at the bottom of the interdigital capacitor, that is, all fourth metal layers are disposed at the bottom of the interdigital capacitor. Alternatively, a part of the at least one fourth metal layer is disposed at the top of the interdigital capacitor, and the other part of the at least one fourth metal layer is disposed at the bottom of the interdigital capacitor.

In a possible implementation, each fourth metal layer includes one or more strip filled metals.

In a possible implementation, to minimize impact of the filled metal on the interdigital capacitor, a length direction of the filled metal is perpendicular to both a length direction of the first finger metal and a length direction of the second finger metal.

In a possible implementation, the interdigital capacitor further includes a substrate, an intrinsic layer (for example, an NT_N layer) is disposed in the substrate, and the at least one first metal layer is disposed on an upper surface of the intrinsic layer, to avoid interference caused by noise in the substrate for the interdigital capacitor.

In a possible implementation, the interdigital capacitor is a metal-oxide-metal (MOM) capacitor, and the MOM capacitor includes a plurality of first metal layers stacked in parallel to each other.

According to a second aspect, this application further provides another interdigital capacitor. The interdigital capacitor includes at least one first metal layer. The following components are disposed in each first metal layer: a first electrode; at least one first finger metal connected to the first electrode; a second electrode; and a plurality of second finger metals connected to the second electrode. The at least one first finger metal is alternately disposed with the plurality of second finger metal to form capacitors, and a quantity of second finger metals is greater than a quantity of first finger metals.

In a possible implementation, first metal electrodes in two adjacent first metal layers are connected to each other using a first conductive channel, and second metal electrodes in the two adjacent first metal layers are connected to each other using a second conductive channel. The first conductive channel and the second conductive channel may be through holes filled with a metal (such as metal tungsten) in a dielectric layer between the two adjacent first metal layers.

In a possible implementation, when the first metal layer includes a plurality of first finger metals, the plurality of first finger metals have different lengths.

In a possible implementation, the plurality of second fingers have different lengths.

In a possible implementation, for any first metal layer in the interdigital capacitor, a quantity of first finger metals, a quantity of second finger metals, an effective length of the first finger metal, and a distance between the first finger metal and the second finger metal that are adjacent to each other are set based on a capacitance value of a capacitor of the first metal layer. The effective length of the first finger metal is a length of a part that is of the first finger metal and that can form a sidewall capacitor with a neighboring second finger metal, the capacitance value of the capacitor of the first metal layer is positively correlated with the quantity of first finger metals, the quantity of second finger metals, and the effective length of the first finger metal, and the capacitance value of the capacitor of the first metal layer is negatively correlated with the distance between the first finger metal and the second finger metal that are adjacent to each other.

In a possible implementation, a distance between two adjacent finger metals including one first finger metal and one second finger metal in the first metal layer is greater than or equal to a first threshold, and a width of the first finger metal and a width of the second finger metal in the first metal layer are greater than or equal to a second threshold. When the distance between two adjacent finger metals including one first finger metal and one second finger metal in the first metal layer is greater than or equal to the first threshold, and a width of each finger metal in the first metal layer is greater than or equal to the second threshold, the interdigital capacitor can be horizontally placed, and can also be vertically placed.

In a possible implementation, the distance between two adjacent finger metals in the first metal layer may be greater than or equal to 0.08 μm, and the width of each finger metal in the first metal layer may be greater than or equal to 0.08 μm.

In a possible implementation, the interdigital capacitor further includes a second metal layer disposed above the at least one first metal layer, and the second metal layer is configured to shield interference caused by an external environment for the at least one first metal layer.

In a possible implementation, the second metal layer includes a third electrode and a plurality of fourth finger metals separately connected to the third electrode. The third electrode is electrically connected, using a third conductive channel, to a first electrode in a first metal layer adjacent to the second metal layer, or the third electrode is electrically connected, using a third conductive channel, to a second electrode in a first metal layer adjacent to the second metal layer. The third conductive channel may be a through hole filled with a metal (such as metal tungsten) in a dielectric layer between the second metal layer and the first metal layer adjacent to the second metal layer.

Further, the second metal layer may further include a fifth electrode. When the third electrode is electrically connected, using the third conductive channel, to the first electrode in the first metal layer adjacent to the second metal layer, the fifth electrode is electrically connected, using a fifth conductive channel, to a second electrode in the first metal layer adjacent to the second metal layer. Alternatively, when the third electrode is electrically connected, using the third conductive channel, to the second electrode in the first metal layer adjacent to the second metal layer, the fifth electrode is electrically connected, using a fifth conductive channel, to a first electrode in the first metal layer adjacent to the second metal layer.

In a possible implementation, the interdigital capacitor may further include a third metal layer disposed below the at least one first metal layer, and the third metal layer is configured to shield interference caused by an external environment for the at least one first metal layer.

In a possible implementation, the third metal layer includes a fourth electrode and a plurality of fifth finger metals separately connected to the fourth electrode. The fourth electrode is electrically coupled, using a fourth conductive channel, to a first electrode in a first metal layer adjacent to the third metal layer, or the fourth electrode is electrically connected, using a fourth conductive channel, to a second electrode in a first metal layer adjacent to the third metal layer. The fourth conductive channel may be a through hole filled with a metal (such as metal tungsten) in a dielectric layer between the third metal layer and the first metal layer adjacent to the third metal layer.

Further, the third metal layer may further include a sixth electrode. When the fourth electrode is electrically coupled, using the fourth conductive channel, to the first electrode in the first metal layer adjacent to the third metal layer, the sixth electrode is electrically connected, using a sixth conductive channel, to a second electrode in the first metal layer adjacent to the third metal layer. Alternatively, when the fourth electrode is electrically coupled, using the fourth conductive channel, to the second electrode in the first metal layer adjacent to the third metal layer, the sixth electrode is electrically connected, using a sixth conductive channel, to a first electrode in the first metal layer adjacent to the third metal layer.

In a possible implementation, to meet a requirement of a machining process for a metal density in the interdigital capacitor, the interdigital capacitor further includes at least one fourth metal layer, and the fourth metal layer is configured to perform density filling, that is configured to increase a metal density of a layer in which the fourth metal layer is located in the interdigital capacitor. The at least one fourth metal layer is disposed at the top of the interdigital capacitor, that is, all fourth metal layers are disposed on the top of the interdigital capacitor; the at least one fourth metal layer is disposed at the bottom of the interdigital capacitor, that is, all fourth metal layers are disposed at the bottom of the interdigital capacitor. Alternatively, a part of the at least one fourth metal layer is disposed at the top of the interdigital capacitor, and the other part of the at least one fourth metal layer is disposed at the bottom of the interdigital capacitor.

In a possible implementation, each fourth metal layer includes one or more strip filled metals.

In a possible implementation, to minimize impact of the filled metal on the interdigital capacitor, a length direction of the filled metal is perpendicular to both a length direction of the first finger metal and a length direction of the second finger metal.

In a possible implementation, the interdigital capacitor further includes a substrate, an intrinsic layer (for example, an NT_N layer) is disposed in the substrate, and the at least one first metal layer is disposed on an upper surface of the intrinsic layer, to avoid interference caused by noise in the substrate for the interdigital capacitor.

In a possible implementation, the interdigital capacitor is a metal-oxide-metal (MOM) capacitor, and the MOM capacitor includes a plurality of first metal layers stacked in parallel to each other.

According to a third aspect, this application further provides a multiplying digital-to-analog conversion circuit. The multiplying digital-to-analog conversion circuit includes a switched capacitor array, a feedback capacitor, and an operational amplifier. The switched capacitor array includes k switches and k interdigital capacitors according to any one of the first aspect, the second aspect, or the possible implementations of the first aspect and the second aspect that are in a one-to-one correspondence with the k switches, where k is a positive integer. For any one of the k switches, the switch is configured to selectively output a to-be-processed voltage or a reference voltage to a first terminal of an interdigital capacitor corresponding to the switch, and a second terminal of the interdigital capacitor corresponding to the switch is separately coupled to a first input terminal of the operational amplifier and a first terminal of the feedback capacitor. A second terminal of the operational amplifier is grounded, and a second terminal of the feedback capacitor is coupled to an output terminal of the operational amplifier.

In a possible implementation, capacitance values of the k interdigital capacitors are respectively C, 2C, $2^2$C, . . . , and $2^{k-1}$C, where C is a constant.

BRIEF DESCRIPTION OF DRAWINGS

FIG. 6A to FIG. 6D are a schematic diagram 5 of a structure of a first metal layer in an interdigital capacitor according to an embodiment of this application;

DESCRIPTION OF EMBODIMENTS

A MOM capacitor is manufactured using a combination of a finger structure and stacking, such that a capacitor with a larger capacitance value can be manufactured in a relatively small area. With evolution of a machining process and an increase of a cabling parasitic capacitance, a difficulty in implementing a high-precision MOM capacitor correspondingly increases. A capacitance value of an existing MOM capacitor changes with a quantity of finger metals and a ratio W/L of a width W of the finger metal to a length L of the finger metal, and cannot change in an equal proportion. This causes a relatively high capacitor mismatch rate, limiting improvement of performance of an ADC that is based on a binary weighted capacitor network.

Figure 1:
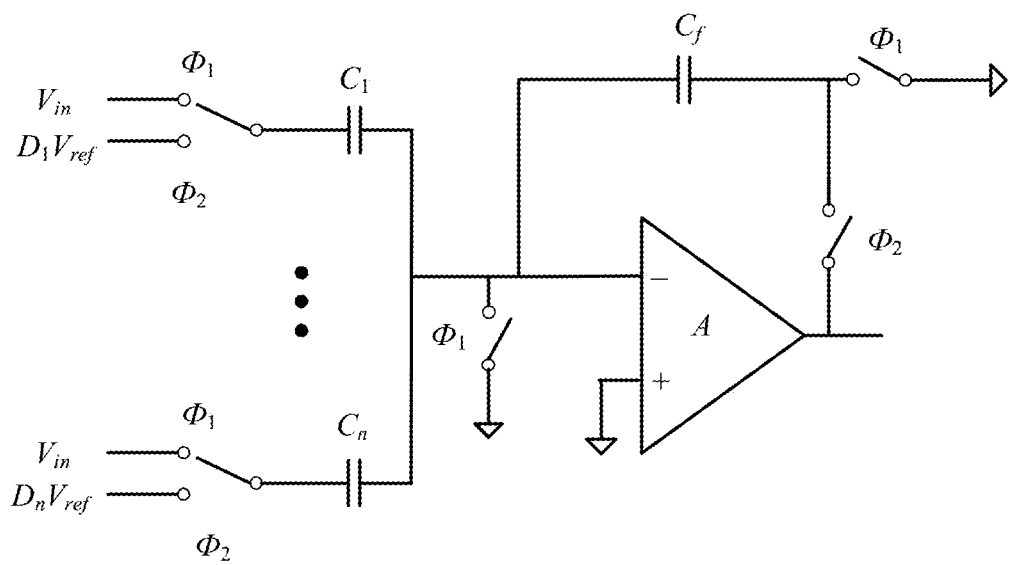
FIG. 1 is a schematic diagram of a structure of an MDAC in the conventional technology.
Figure 2:
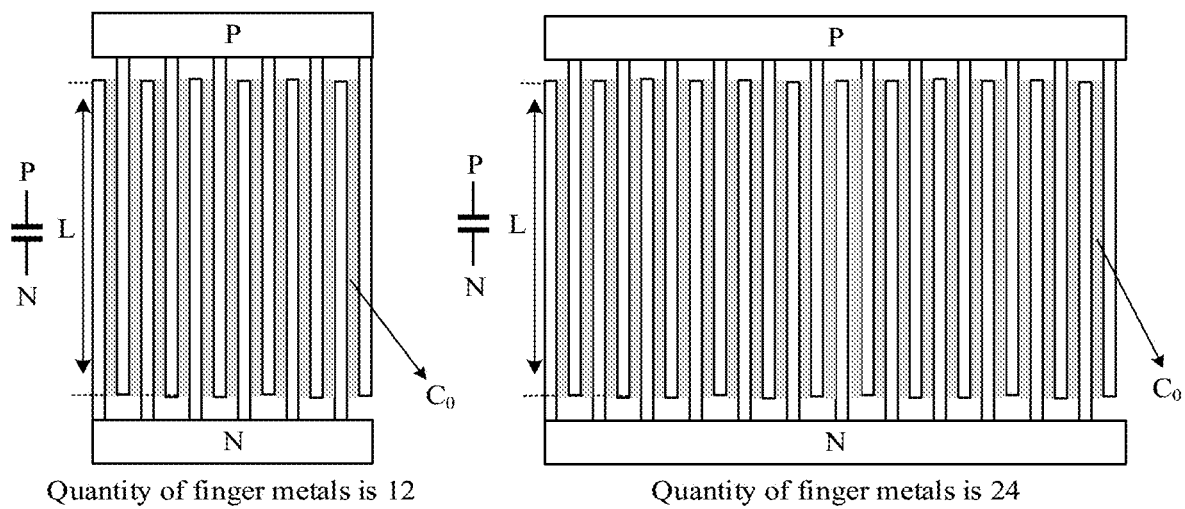
FIG. 2 is a schematic diagram of a structure of a MOM capacitor in the conventional technology.
Figure 3:
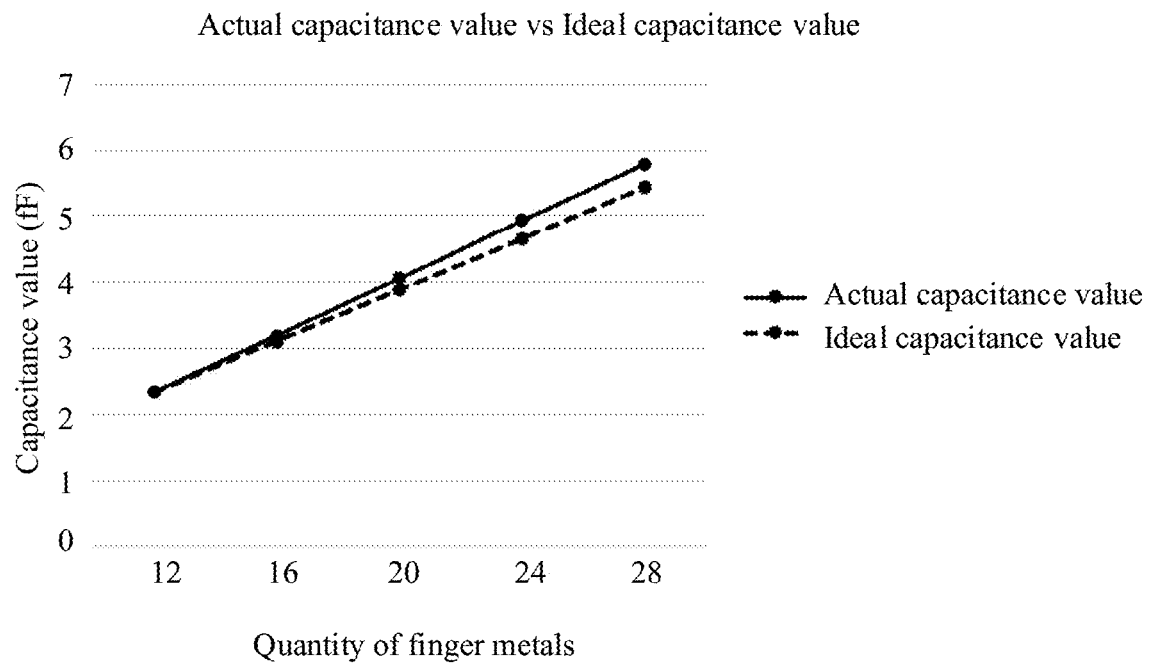
FIG. 3 is a schematic diagram of a relationship between a capacitance value of an interdigital capacitor and a quantity of finger metals in the interdigital capacitor according to an embodiment of this application.

In deployment of the existing MOM capacitor, based on a requirement of a machining process, a quantity of finger metal electrodes is 4*N (N is an integer, and * represents multiplying), and a capacitance value of the MOM capacitor is mainly determined by a sidewall capacitor formed by two adjacent finger metals. For example, as shown in FIG. 2, in a vertically placed MOM capacitor, assuming that a capacitance value of a unit capacitor formed by two adjacent finger metals in the MOM capacitor is $C_0$, if a width and a length of the finger metal do not change, when the MOM capacitor includes 12 finger metals, a capacitance value of the MOM capacitor is 11*$C_0$; and when the MOM capacitor includes 24 finger metals, a capacitance value of the MOM capacitor is 23*$C_0$, that is, a capacitance value of the MOM capacitor is always (M−1)*$C_0$, where M is a quantity of finger metals included in the MOM capacitor. Therefore, when the quantity of finger metals in the MOM capacitor changes in an equal proportion, the capacitance value of the MOM capacitor does not change in the same proportion, as shown in FIG. 3, where an actual capacitance value is the capacitance value of the existing MOM capacitor, and an ideal capacitance value is a capacitance value that is of the MOM capacitor and that changes in an equal proportion with the quantity of finger metals. It may be learned from FIG. 3 that when the quantity of finger metals in the MOM capacitor changes in proportion, the actual capacitance value is greater than the ideal capacitance value, and consequently a linear error is caused for an ADC that is based on a binary weighted capacitor network.

In addition, a capacitance value of a MOM capacitor that is of a minimum size and that is provided by an existing 16 nanometer (nm) process library is 2.33 femtofarad (fF). For an ADC circuit design with a relatively high precision requirement, a capacitance value of a minimum capacitor is required to reach 0.25 fF. Therefore, this needs to be implemented by connecting a plurality of capacitors in series, causing high layout area overheads.

Based on this, this application provides an interdigital capacitor and a multiplying digital-to-analog conversion circuit, to improve the foregoing defects of an MOM capacitor according to other approaches.

Figure 4A:
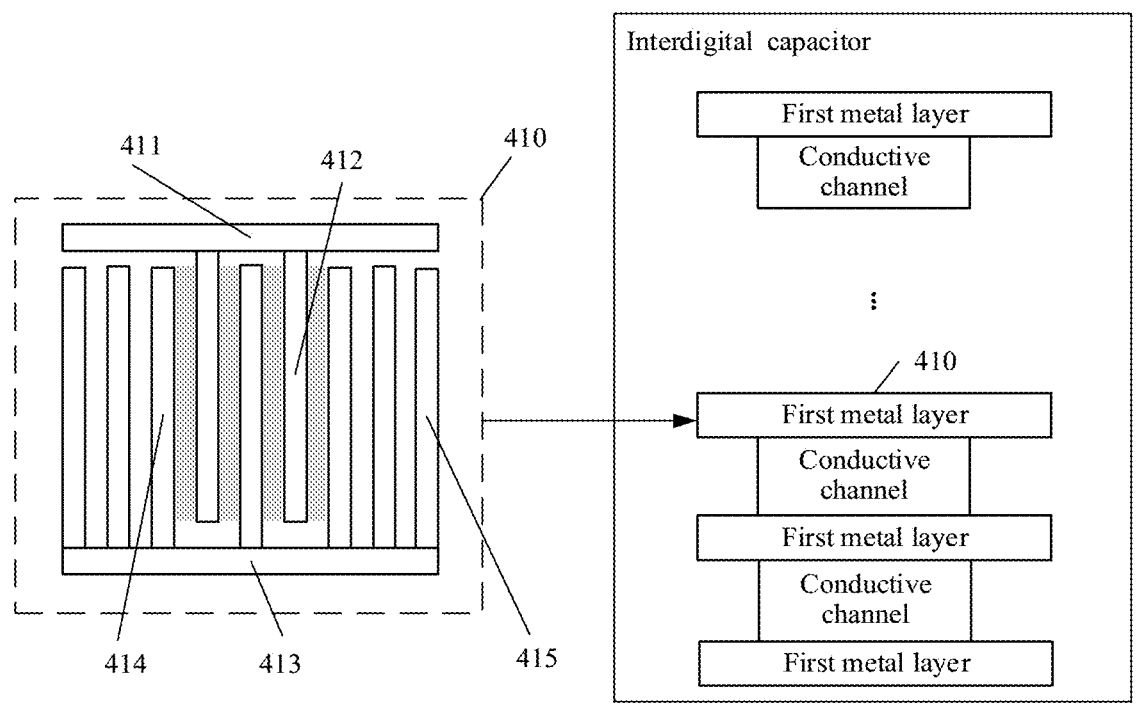
FIG. 4A is a schematic diagram 1 of a structure of an interdigital capacitor according to an embodiment of this application.

This application provides an interdigital capacitor. The interdigital capacitor may be a MOM capacitor. As shown in FIG. 4A, the interdigital capacitor includes at least one first metal layer 410. The following components are disposed in each first metal layer 410: a first electrode 411; at least one first finger metal 412 connected to the first electrode 411; a second electrode 413; and a plurality of (two or more) second finger metals 414 connected to the second electrode 413, and at least one third finger metal 415 connected to the second electrode 413. The at least one first finger metal 412 is alternately disposed with the plurality of second finger metals 414 to form capacitors, and the at least one third finger metal 415 is a dummy finger metal. A person skilled in the art should know that, during designing of an integrated circuit, in addition to designing a circuit that can implement logic or a function of the circuit, to ensure correct Layout Versus Schematics (LVS) verification, some LVS-independent graphs, that is, dummy circuits, are added based on a design requirement. Therefore, it may be understood that the at least one third finger metal 415 serving as a dummy circuit does not form a capacitor with any one of the at least one first finger metal 412 and the plurality of second finger metal 414.

The first electrode may be a positive electrode, or may be a negative electrode. When the first electrode is a positive electrode, the second electrode is a negative electrode. Alternatively, when the first electrode is a negative electrode, the second electrode is a positive electrode. The first finger metal 412, the second finger metal 414, and the third finger metal 415 are finger metals connected to corresponding electrodes in the interdigital capacitor. The first finger metal 412, the second finger metal 414, and the third finger metal 415 in the first metal layer 410 of the interdigital capacitor are usually a plurality of mutually parallel conductive electrodes obtained by photoetching and etching a metal in the first metal layer 410, and are usually arranged in a comb shape (that is, a comb structure). The first finger metal 412, the second finger metal 414, and the third finger metal 415 are comb tooth parts. Therefore, finger metals (the first finger metal 412, the second finger metal 414, and the third finger metal 415) in the interdigital capacitor may also be referred to as electrode fingers. That the at least one first finger metal 412 is alternately disposed with the plurality of second finger metals 414 indicates that the first finger metal 412 and the second finger metal 414 are arranged in turn repeatedly. For example, as shown in FIG. 4A, the first metal layer 410 includes two first finger metals 412 and three second finger metals, and the five finger metals appear in turn in a horizontal direction according to a rule that the second finger metal 414 is followed by the first finger metal 412.

When the interdigital capacitor includes a plurality of (two or more) first metal layers 410, the plurality of first metal layers 410 may be stacked in parallel to each other. When the interdigital capacitor is a MOM capacitor, the MOM capacitor usually includes a plurality of first metal layers 410 stacked in parallel to each other. Further, first metal electrodes 411 in two adjacent first metal layers 410 are connected to each other using a first conductive channel, and second metal electrodes 413 in the two adjacent first metal layers 410 are connected to each other using a second conductive channel. The first conductive channel and the second conductive channel may be through holes filled with a metal (such as metal tungsten) in a dielectric layer between the two adjacent first metal layers 410.

A dielectric (not shown in FIG. 4A, and usually an oxide) may be disposed between a first finger metal 412 and a second finger metal 414 that are adjacent to each other in a same first metal layer 410, and two adjacent first metal layers 410 may also be separated by a dielectric layer (not shown in FIG. 4A).

Because one or more dummy finger metals—third finger metals 415 exist in the first metal layer 410 of the interdigital capacitor, when a layout area of the interdigital capacitor is specific, a capacitance value of the interdigital capacitor may be flexibly changed by adjusting parameters such as a quantity of first finger metals 412, a quantity of second finger metals 414, a quantity of third finger metals 415, a length of the first finger metal 412, and a length of the second finger metal 414. In addition, because the one or more dummy finger metals exist in the first metal layer 410 of the interdigital capacitor, interdigital capacitors with different capacitance values may have a same layout size. This facilitates layout deployment and proper area utilization of a circuit in which the interdigital capacitors are located, and helps reduce a process deviation between interdigital capacitors with different capacitance values, such that matching performance of the interdigital capacitor can be improved.

Figure 4B:
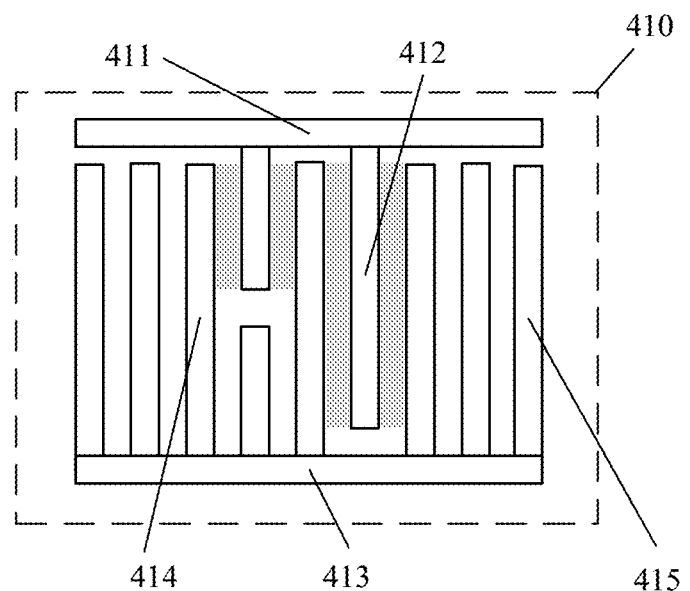
FIG. 4B is a schematic diagram 1 of a structure of a first metal layer according to an embodiment of this application.
Figure 4C:
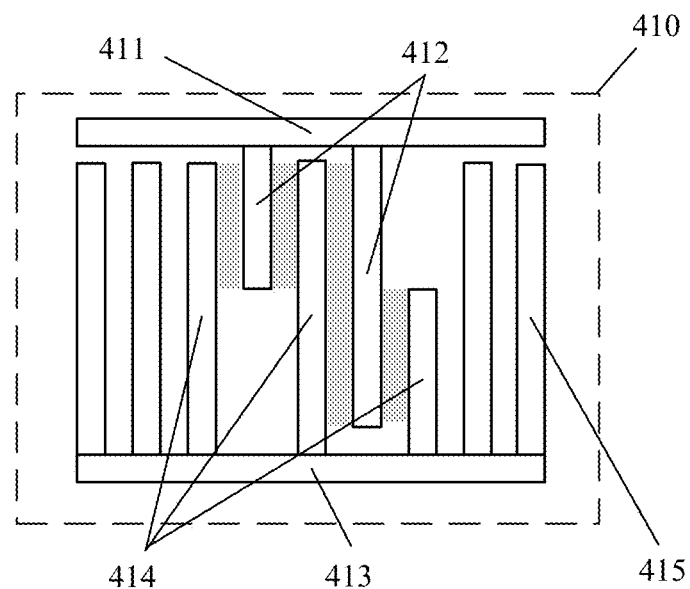
FIG. 4C is a schematic diagram 2 of a structure of a first metal layer according to an embodiment of this application.
Figure 4D:
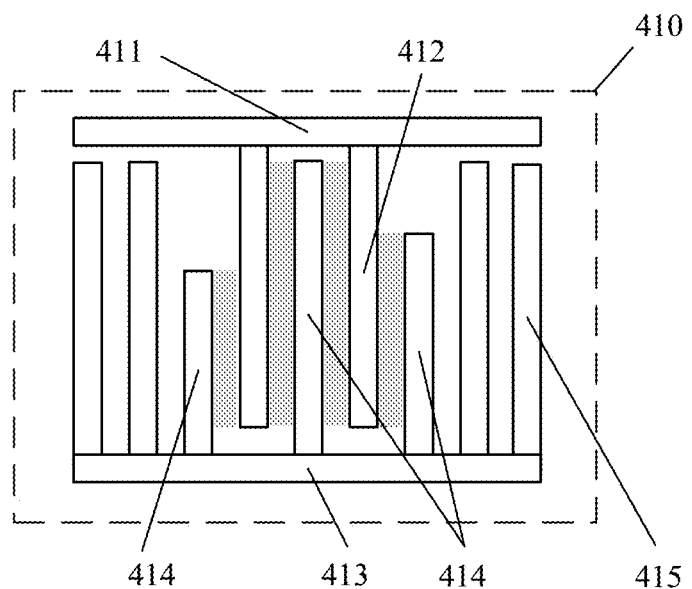
FIG. 4D is a schematic diagram 3 of a structure of a first metal layer according to an embodiment of this application.

Further, when the first metal layer 410 includes a plurality of first finger metals 412, the plurality of first finger metals 412 have different lengths, and the plurality of second finger metals 414 may have a same length or may have different lengths. That is, the plurality of first finger metals 412 have different lengths, and the plurality of second finger metals 414 have a same length, as shown in FIG. 4B. Alternatively, the plurality of first finger metals 412 have different lengths, and the plurality of second finger metals 414 also have different lengths, as shown in FIG. 4C. Alternatively, the plurality of second fingers 414 have different lengths, as shown in FIG. 4D. In this case, every two adjacent finger metals including one first finger metal 412 and one second finger metal 414 in the first metal layer 410 may form a different capacitor, such that a capacitance value of a capacitor of the first metal layer 410 can more flexibly change based on an actual requirement.

It should be noted that, that the plurality of first finger metals 412 have different lengths indicate that some or all of the plurality of first finger metals 412 have different lengths, and that the plurality of second finger metals 414 have different lengths indicate that some or all of the plurality of second finger metals 414 have different lengths.

Figure 4E:
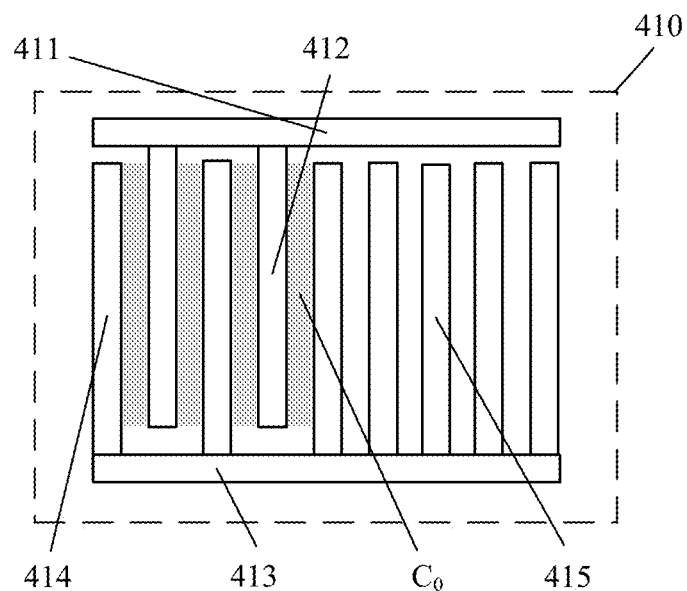
FIG. 4E is a schematic diagram 4 of a structure of a first metal layer according to an embodiment of this application.

Further, as shown in FIG. 4E, all the at least one third finger metal 415 may be located on a same side of the plurality of second finger metals 414. Alternatively, when the first metal layer 410 includes a plurality of third finger metals 415, the plurality of third finger metals 415 are located on two sides of the plurality of second finger metals 414, as shown in FIG. 4A. In addition, when a length of a second finger metal 414 is greater than a length of a first finger metal 412 adjacent to the second finger metal, a third finger metal 415 may be alternatively located at an opposite position to the first finger metal 412 adjacent to the second finger metal 414, and a sum of a length of the third finger metal 415 and the length of the first finger metal 412 is less than the length of the second finger metal 414. That is, when the first metal layer 410 includes a plurality of third finger metals 415, some or all of the plurality of third finger metals 415 may have different lengths.

In an implementation, the quantity of first finger metals 412, the quantity of second finger metals 414, an effective length of the first finger metal 412 (an effective length of a second finger metal 414 that forms a sidewall capacitor is the same as an effective length of a first finger metal 412 that forms the sidewall capacitor), and a distance between the first finger metal 412 and the second finger metal 414 that are adjacent to each other are set based on the capacitance value of the capacitor of the first metal layer 410. The effective length of the first finger metal 412 is a length of a part that is of the first finger metal 412 and that can form a sidewall capacitor with a neighboring second finger metal 414, the capacitance value of the capacitor of the first metal layer 410 is positively correlated with the quantity of first finger metals 412, the quantity of second finger metals 414, and the effective length of the first finger metal 412, and the capacitance value of the capacitor of the first metal layer 410 is negatively correlated with the distance between the first finger metal 412 and the second finger metal 414 that are adjacent to each other.

For example, for any first metal layer 410 in the interdigital capacitor, a capacitance value of a capacitor of the first metal layer 410 is a sum of capacitance values of a plurality of sidewall capacitors formed by at least one first finger metal 412 and a plurality of second finger metals 414 in the first metal layer 410. The sidewall capacitor is a capacitor formed between one first finger metal 412 and one second finger metal 414 that are adjacent to each other, and the interdigital capacitor is obtained by connecting, in parallel, capacitors of first metal layers 410 included in the interdigital capacitor. Therefore, to implement an interdigital capacitor with a specified capacitance value, a quantity of sidewall capacitors formed by the at least one first finger metal 412 and the plurality of second finger metals 414 and a capacitance value of each sidewall capacitor are set based on the capacitance value of the capacitor of the first metal layer 410. The quantity of sidewall capacitors formed by the at least one first finger metal 412 and the plurality of second finger metals 414 is related to a quantity of first finger metals 412 and a quantity of second finger metals 414, and N1 first finger metals 412 and N2 second finger metals 414 may form (N1+N2)−1 sidewall capacitors. In this case, the capacitance value of the capacitor of the first metal layer 410 is $\Sigma_{i=1}^{(N1+N2)-1} C_i$, where $C_i$ is a capacitance value of an $i^{th}$ sidewall capacitor in the (N1+N2)−1 sidewall capacitors.

All first finger metals 412 included in the first metal layer 410 may have a same length or may have different lengths, all second finger metals 414 included in the first metal layer 410 may have a same length or may have different lengths, the first finger metal 412 and the second finger metal 414 that are included in the first metal layer 410 may have a same length or may have different lengths, there may be a same or different distance between every two adjacent finger metals including one first finger metal 412 and one second finger metal 414 in the first metal layer 410, and so no. Therefore, N−1 sidewall capacitors may have a same capacitance value or may have different capacitance values. In most cases, each first finger metal 412 and each second finger metal 414 that are included in the first metal layer 410 have a same length, there is a same distance between the first finger metal 412 and the second finger metal 414 that are adjacent to each other, the (N1+N2)−1 sidewall capacitors have equal capacitance values, and a sum of the capacitance values of the N−1 sidewall capacitors is ((N1+N2)−1)*C, where C is a capacitance value of any one of the (N1+N2)−1 sidewall capacitors.

Further, an effective length of a first finger metal 412 that forms a sidewall capacitor and a distance between the first finger metal 412 and a second finger metal 414 that form the sidewall capacitor are set based on a capacitance value of the sidewall capacitor, and the effective length of the first finger metal is a length of a part that is of the first finger metal and that can form the sidewall capacitor with the neighboring second finger metal. The capacitance value of the sidewall capacitor is positively correlated to a length of a shortest finger metal in the first finger metal 412 and the second finger metal 414 that form the sidewall capacitor, that is, when other parameters of the first finger metal 412 and the second finger metal 414 (a width of the first finger metal 412, a width of the second finger metal 414, and the distance between the first finger metal 412 and the second finger metal 414) that form the sidewall capacitor do not change, a larger length of the shortest finger metal in the first finger metal 412 and the second finger metal 414 that form the sidewall capacitor indicates a larger capacitance value of the sidewall capacitor, and a smaller length of the shortest finger metal in the first finger metal 412 and the second finger metal 414 indicates a smaller capacitance value of the sidewall capacitor. The capacitance value of the sidewall capacitor is negatively correlated with the distance between the first finger metal 412 and the second finger metal 414 that form the sidewall capacitor, that is, when other parameters of the first finger metal 412 and the second finger metal 414 (the width of the first finger metal 412, the width of the second finger metal 414, a length of the first finger metal 412, and a length of the second finger metal) that form the sidewall capacitor do not change, a larger distance between the first finger metal 412 and the second finger metal 414 adjacent to the first finger metal 412 that form the sidewall capacitor indicates a smaller capacitance value of the sidewall capacitor, and a smaller distance between the first finger metal 412 and the second finger metal 414 adjacent to the first finger metal 412 that form the sidewall capacitor indicates a larger capacitance value of the sidewall capacitor.

In a scenario in which the width of the first finger metal 412 is equal to the width of the second finger metal 414, the capacitance value $C_0$ of the sidewall capacitor meets the following conditions with the effective length L of each of the first finger metal 412 and the second finger metal 414 that form the sidewall capacitor, the width W of the first finger metal 412 (or the second finger metal 414), and the distance S between the first finger metal 412 and the second finger metal 414 that form the sidewall capacitor:

$$C_0 = \frac{\varepsilon * W * L}{S},$$

where $\varepsilon$ is a dielectric coefficient of a dielectric between the first finger metal 412 and the second finger metal 414 that form the sidewall capacitor, and where L is a length of each of parts that are of the first finger metal 412 and the second finger metal 414 and that can form the capacitor.

In an actual application, due to a limitation of a machining process, a capacitance value of a MOM capacitor that is of a minimum size and that is provided by an existing 16 nm process library is 2.33 fF. For an ADC circuit design with a relatively high precision requirement, a capacitance value of a minimum capacitor is required to reach 0.25 fF. Therefore, this needs to be implemented by connecting a plurality of capacitors in series, causing high layout area overheads. However, according to the interdigital capacitor provided in this embodiment of this application, an interdigital capacitor with a smaller capacitance value may be obtained by adjusting the length of the first finger metal 412, the length of the second finger metal, the quantity of first finger metals 412, and the quantity of second finger metals 414. For example, the interdigital capacitor provided in this embodiment of this application may reach 1.202 fF or even a smaller value. Compared with a minimum capacitance 2.33178 fF that can be provided by the existing process library, the capacitance value of the interdigital capacitor provided in this embodiment of this application is reduced by 50%. For example, the distance between two adjacent finger metals including one first finger metal 412 and one second finger metal 414 may be greater than or equal to 0.08 μm.

Figure 5A:
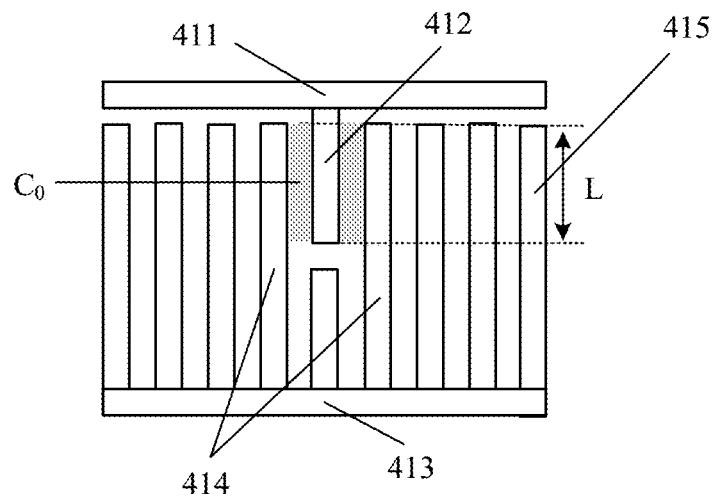
FIG. 5A is a schematic diagram of a structure of a horizontally placed interdigital capacitor according to an embodiment of this application.
Figure 5B:
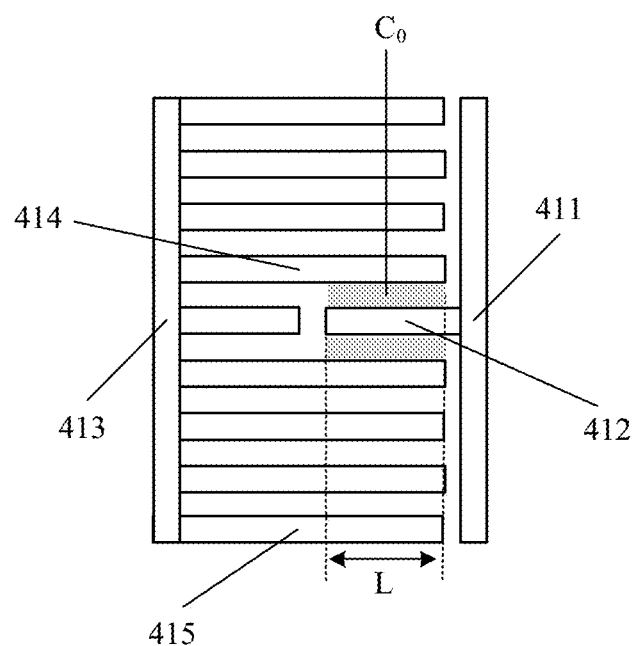
FIG. 5B is a schematic diagram of a structure of a vertically placed interdigital capacitor according to an embodiment of this application.

Further, during machining of the interdigital capacitor, when the interdigital capacitor is placed in different directions (horizontally or vertically placed), a machining process also requires different distances between adjacent finger metals in the interdigital capacitor and widths of the finger metal in the interdigital capacitor. Therefore, to ensure that the interdigital capacitor can be horizontally placed (as shown in FIG. 5A), and can also be vertically placed (as shown in FIG. 5B), that is, the interdigital capacitor can be arbitrarily flipped, a distance between two adjacent finger metals (including the distance between the first finger metal 412 and the second finger metal 414 that are adjacent to each other, a distance between the second finger metal 414 and the third finger metal 415 that are adjacent to each other, and a distance between adjacent third finger metals) in the first metal layer 410 is greater than or equal to a first threshold, and width of each finger metal (including the width of the first finger metal 412, the width of the second finger metal 414, and a width of the third finger metal 415) in the first metal layer 410 is greater than or equal to a second threshold, to meet a minimum width and spacing design rule check (DRC) for horizontal and vertical placement, such that the interdigital capacitor can be horizontally placed, and can also be vertically placed. For the 16 nm process library, the first threshold may be 0.08 μm, and the second threshold may be 0.08 μm.

For example, first metal layers 410 shown in FIG. 6A to FIG. 6D have a same area, and the first metal layers 410 shown in (a) to (d) are the same in a width of a first finger metal 412, a width of a second finger metal 414, and a distance between two adjacent finger metals including one first finger metal 412 and one second finger metal 414. A first metal layer 410 shown in FIG. 6A includes one first finger metal 412, two second finger metals 414, and seven third finger metals 415, and a length of each of parts that are of the first finger metal 412 and the second finger metal 414 and that can form a capacitor, that is, an effective length of each of the first finger metal 412 and the second finger metal 414, is L. In this case, a capacitance of the first metal layer 410 is $C_1$. A first metal layer 410 shown in FIG. 6B includes one first finger metal 412, two second finger metals 414, and six third finger metals 415, and a length of each of parts that are of the first finger metal 412 and the second finger metal 414 and that can form a capacitor, that is, an effective length of each of the first finger metal 412 and the second finger metal 414, is 2L. In this case, a theoretical capacitance value of the first metal layer 410 is $2C_1$. A first metal layer 410 shown in FIG. 6C includes two first finger metals 412, three second finger metals 414, and four third finger metals 415, and a length of each of parts that are of the first finger metal 412 and the second finger metal 414 and that can form a capacitor, that is, an effective length of each of the first finger metal 412 and the second finger metal 414, is 2L. In this case, a theoretical capacitance value of the first metal layer 410 is $4C_1$. By analogy, different capacitance values can be obtained. Because the third finger metal 415 in the first metal layer 410 is a dummy metal and makes no contribution to the capacitance value of the first metal layer 410, when a larger capacitance value needs to be configured for the first metal layer 410, the first metal layer 410 may have no third finger metal. For example, a first metal layer 410 shown in FIG. 6D includes four first finger metals 412 and five second finger metals 414, and a length of each of parts that are of the first finger metal 412 and the second finger metal 414 and that can form a capacitor, that is, an effective length of each of the first finger metal 412 and the second finger metal 414, is 2L. In this case, a theoretical capacitance value of the first metal layer 410 is $8C_1$.

In a scenario in which the first metal layer 410 includes no third finger metal 415, a quantity of first finger metals 412 is not equal to a quantity of second finger metals 414 in the first metal layer 410, and a difference between the quantity of first finger metals 412 and the quantity of second finger metals 414 in the first metal layer 410 is 1, such that the capacitance value of the capacitor of the first metal layer 410 can change in an equal proportion, as shown in, for example, FIG. 6D.

When the width of the first finger metal 412 and the width of the second finger metal 414 are both 0.08 micrometers (μm), and L is 3.16 μm, a result shown in Table 1 may be obtained by simulating layouts of the first metal layers 410 shown in FIG. 6A to FIG. 6D. It may be learned from Table 1 that, the capacitance value of the interdigital capacitor may be changed in an equal proportion by adjusting parameters such as the quantity of first finger metals 412, the quantity of second finger metals 414, and the effective length of each of the first finger metal 412 and the second finger metal 414 in the first metal layer 410. A capacitance value of a capacitor in a capacitor network in an ADC that is based on a capacitor network usually changes according to the law of a geometric sequence with a common ratio of 2. Therefore, when the interdigital capacitor provided in this application is used as the capacitor in the capacitor network in the ADC that is based on a capacitor network, because the interdigital capacitor provided in this embodiment of this application can implement high precision by adjusting parameters of the first finger metal 412 and the second finger metal 414 in the first metal layer, and the capacitance value of the interdigital capacitor can change in an equal proportion, conversion precision and output result linearity of the ADC that is based on a capacitor network can be effectively improved.

TABLE 1

Capacitor capacitance value simulation result

| | Quantity of first finger metals | Quantity of second finger metals | Finger metal width (μm) | Finger metal length (μm) | Capacitance value (fF) |
|---|---|---|---|---|---|
| (a) | 1 | 2 | 0.08 | L = 3.168 | 1.202 |
| (b) | 1 | 2 | 0.08 | 2 * L = 6.336 | 2.406 |
| (c) | 2 | 3 | 0.08 | 2 * L = 6.336 | 4.815 |
| (d) | 4 | 5 | 0.08 | 2 * L = 6.336 | 9.640 |

In addition, in an implementation, to shield impact of an external environment on the interdigital capacitor, the interdigital capacitor provided in this embodiment of this application further includes a second metal layer 420 disposed above the at least one first metal layer 410, and the second metal layer 420 is configured to shield interference caused by an external environment for the at least one first metal layer 410.

Figure 7A:
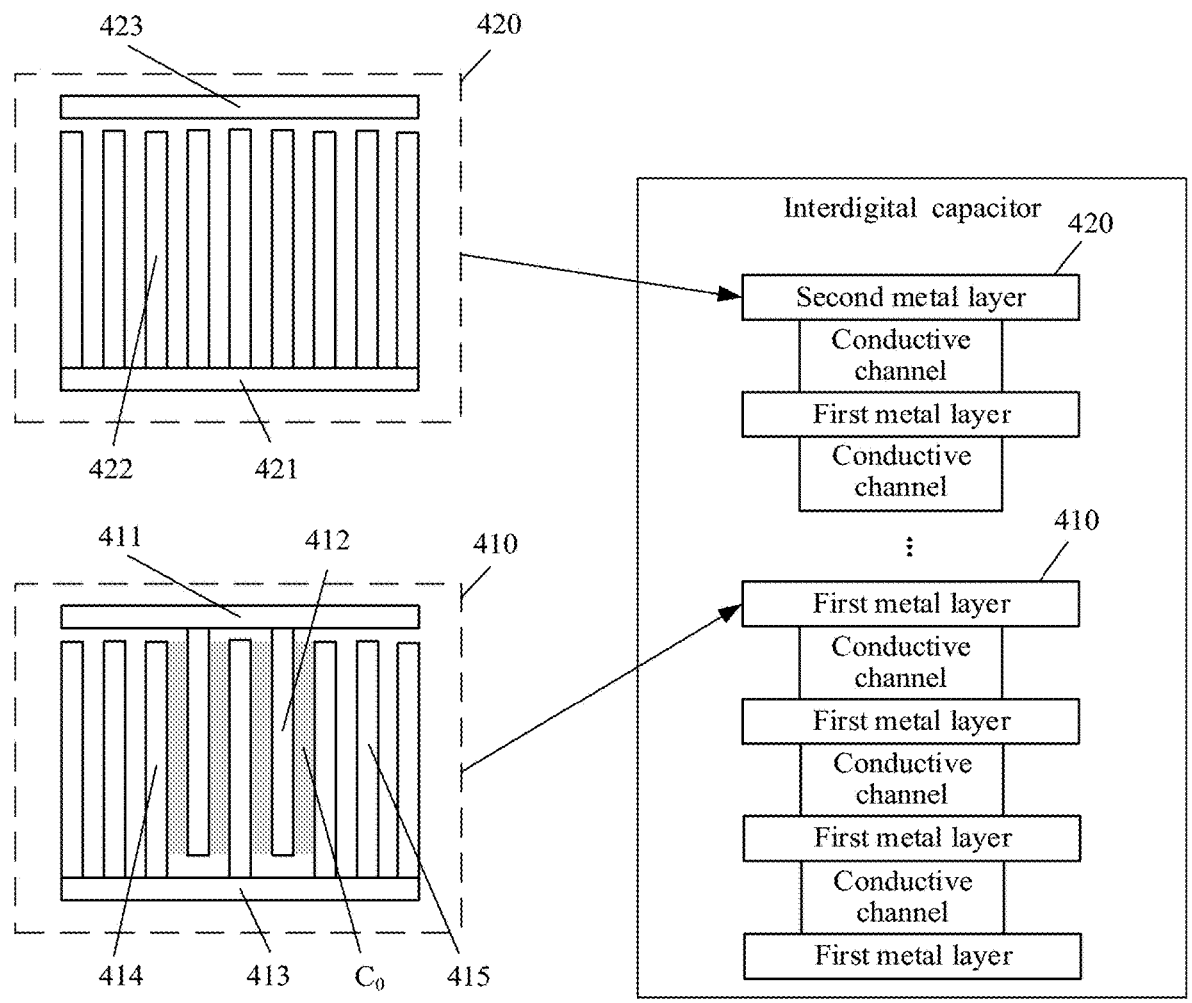
FIG. 7A is a schematic diagram 2 of a structure of an interdigital capacitor according to an embodiment of this application.

For example, as shown in FIG. 7A, the second metal layer 420 includes a third electrode 421 and a plurality of fourth finger metals 422 separately connected to the third electrode 421. The third electrode 421 is electrically connected, using a third conductive channel, to a first electrode 411 in a first metal layer 410 adjacent to the second metal layer 420, or the third electrode 421 is electrically connected, using a third conductive channel, to a second electrode 413 in a first metal layer 410 adjacent to the second metal layer 420. The third conductive channel may be a through hole filled with a metal (such as metal tungsten) in a dielectric layer between the second metal layer 420 and the first metal layer 410 adjacent to the second metal layer.

Further, the second metal layer 420 may further include a fifth electrode 423. When the third electrode 421 is electrically connected, using the third conductive channel, to the first electrode 411 in the first metal layer 410 adjacent to the second metal layer 420, the fifth electrode 423 is electrically connected, using a fifth conductive channel, to a second electrode 413 in the first metal layer 410 adjacent to the second metal layer 420. Alternatively, when the third electrode 421 is electrically connected, using the third conductive channel, to the second electrode 413 in the first metal layer 410 adjacent to the second metal layer 420, the fifth electrode 423 is electrically connected, using a fifth conductive channel, to a first electrode 411 in the first metal layer 410 adjacent to the second metal layer 420.

In addition, to ensure that the fourth finger metal 422 in the second metal layer 420 generates a same parasitic capacitance for the first finger metal 412 and the second finger metal 414 in the first metal layer 410 to avoid capacitor mismatch, a distance between a fourth finger metal 422 corresponding to a first finger metal 412 and a fourth finger metal 422 corresponding to a second finger metal 414 is the same as a distance between the first finger metal 412 and the second finger metal 414, and size parameters (such as a length and a width) of the fourth finger metal 422 corresponding to the first finger metal 412 in the second metal layer 420 are the same as parameters (such as a length and a width) of the fourth finger metal 422 corresponding to the second finger metal 414 in the second metal layer 420.

To shield impact of an external environment on the interdigital capacitor, the interdigital capacitor provided in this embodiment of this application may further include a third metal layer 430 disposed below the at least one first metal layer 410, and the third metal layer 430 is configured to shield interference caused by an external environment for the at least one first metal layer 410.

Figure 7B:
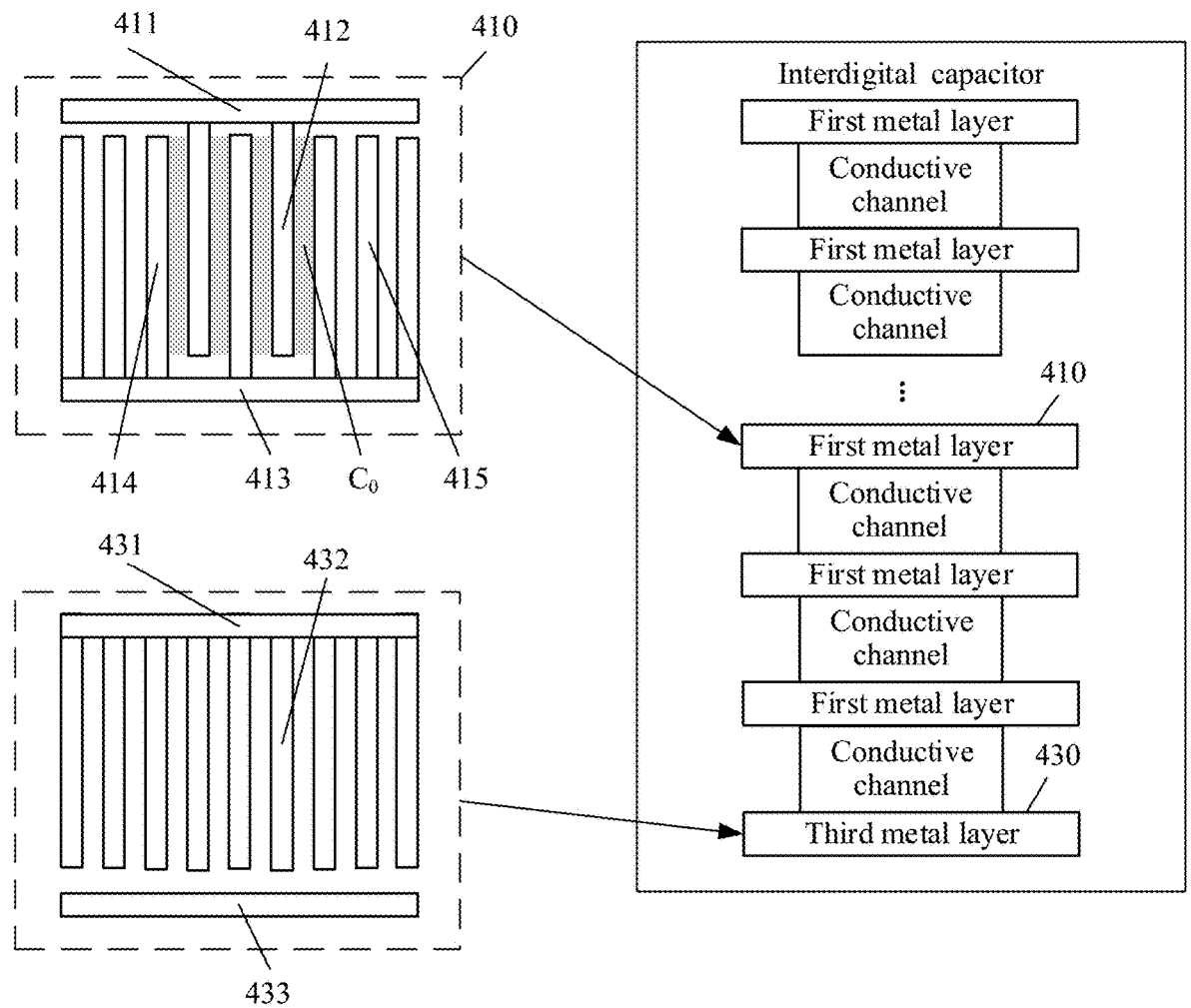
FIG. 7B is a schematic diagram 3 of a structure of an interdigital capacitor according to an embodiment of this application.

For example, as shown in FIG. 7B, the third metal layer 430 includes a fourth electrode 431 and a plurality of fifth finger metals 432 separately connected to the fourth electrode 431. The fourth electrode 431 is electrically coupled, using a fourth conductive channel, to a first electrode 411 in a first metal layer 410 adjacent to the third metal layer 430, or the fourth electrode 431 is electrically connected, using a fourth conductive channel, to a second electrode 413 in a first metal layer 410 adjacent to the third metal layer 430. The fourth conductive channel may be a through hole filled with a metal (such as metal tungsten) in a dielectric layer between the third metal layer 430 and the first metal layer 410 adjacent to the third metal layer.

The third metal layer 430 may further include a sixth electrode 433. When the fourth electrode 431 is electrically coupled, using the fourth conductive channel, to the first electrode 411 in the first metal layer 410 adjacent to the third metal layer 430, the sixth electrode 433 is electrically connected, using a sixth conductive channel, to a second electrode 413 in the first metal layer 410 adjacent to the third metal layer 430. Alternatively, when the fourth electrode 431 is electrically coupled, using the fourth conductive channel, to the second electrode 413 in the first metal layer 410 adjacent to the third metal layer 430, the sixth electrode 433 is electrically connected, using a sixth conductive channel, to a first electrode 411 in the first metal layer 410 adjacent to the third metal layer 430.

In addition, to ensure that the fifth finger metal 432 in the third metal layer 430 generates a same parasitic capacitance for the first finger metal 412 and the second finger metal 414 in the first metal layer 420 to avoid capacitor mismatch, a distance between a fifth finger metal 432 corresponding to a first finger metal 412 and a fifth finger metal 432 corresponding to a second finger metal 414 is the same as a distance between the first finger metal 412 and the second finger metal 414, and parameters (such as a length and a width) of the fifth finger metal 432 corresponding to the first finger metal 412 in the third metal layer 430 are the same as parameters (such as a length and a width) of the fifth finger metal 432 corresponding to the second finger metal 414 in the third metal layer 430.

Figure 7C:
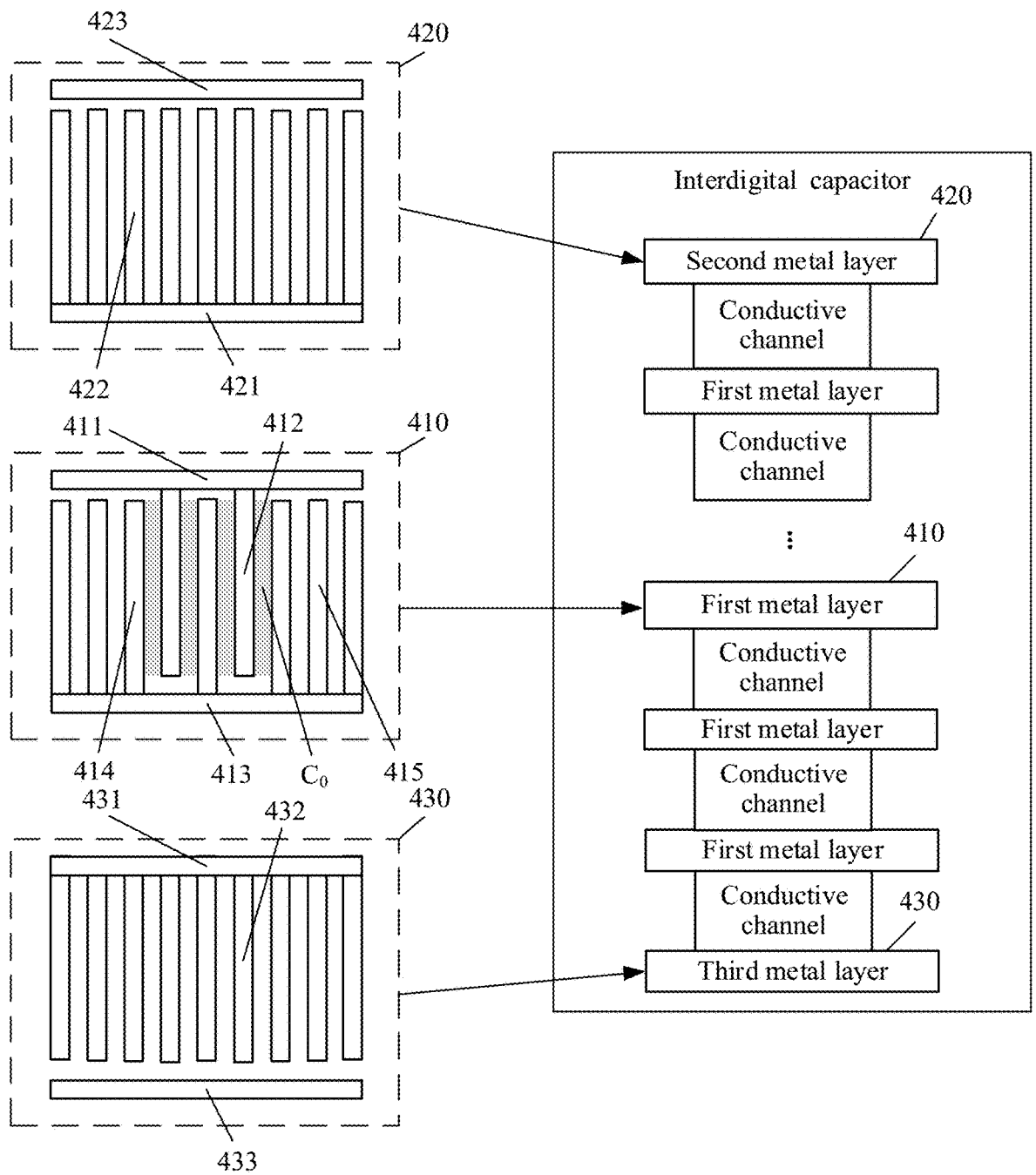
FIG. 7C is a schematic diagram 4 of a structure of an interdigital capacitor according to an embodiment of this application.

That is, the interdigital capacitor provided in this embodiment of this application may include any one of the second metal layer 420 and the third metal layer 430, as shown in FIG. 7A or FIG. 7B, or include both the second metal layer 420 and the third metal layer 430, as shown in FIG. 7C.

Figure 8:
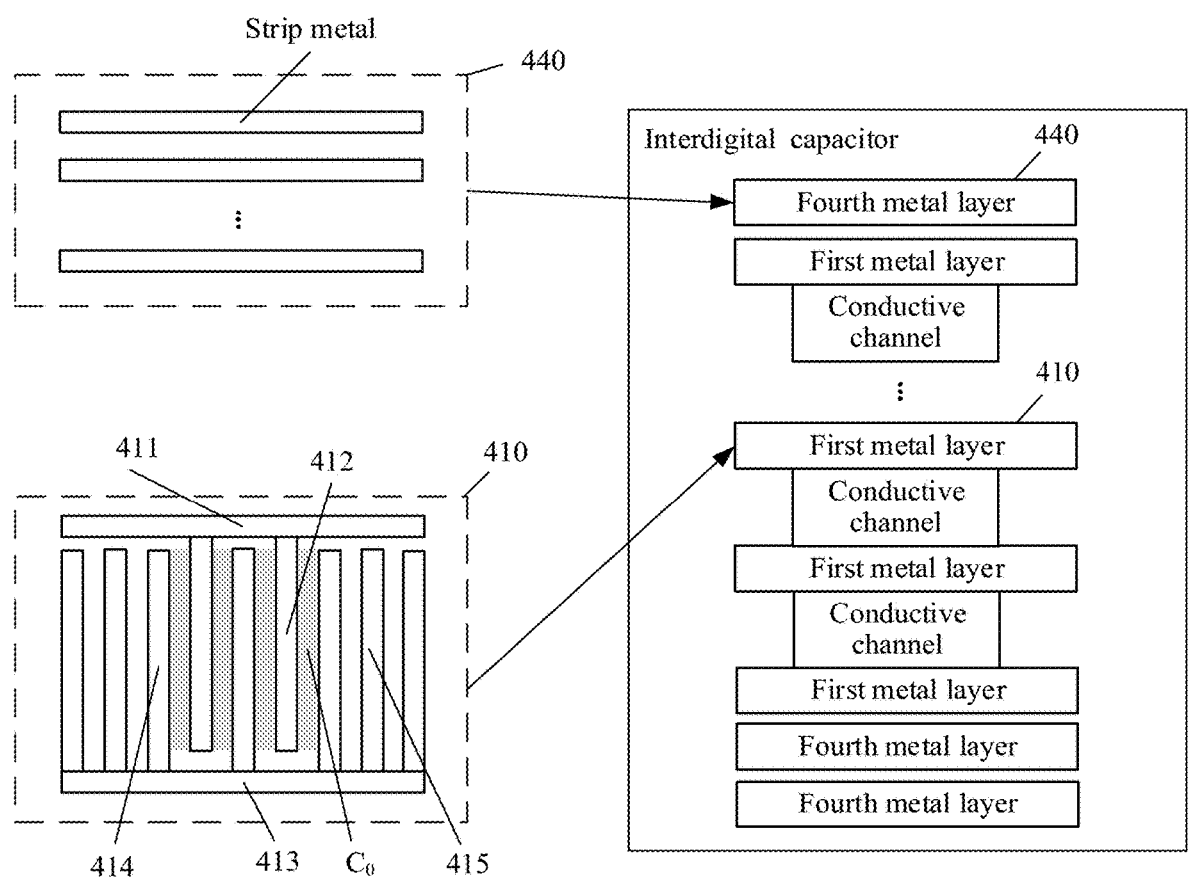
FIG. 8 is a schematic diagram 5 of a structure of an interdigital capacitor according to an embodiment of this application.

Further, to meet a requirement of a machining process for a metal density in the interdigital capacitor, as shown in FIG. 8, the interdigital capacitor provided in this embodiment of this application further includes at least one fourth metal layer 440, and the fourth metal layer 440 is configured to perform density filling, that is configured to increase a metal density of a layer in which the fourth metal layer 440 is located in the interdigital capacitor. The at least one fourth metal layer 440 is disposed at the top of the interdigital capacitor, that is, all fourth metal layers 440 are disposed on the top of the interdigital capacitor; the at least one fourth metal layer 440 is disposed at the bottom of the interdigital capacitor, that is, all fourth metal layers 440 are disposed at the bottom of the interdigital capacitor. Alternatively, a part of the at least one fourth metal layer 440 is disposed at the top of the interdigital capacitor, and the other part of the at least one fourth metal layer 440 is disposed at the bottom of the interdigital capacitor.

In a scenario in which the interdigital capacitor includes neither the second metal layer 420 nor the third metal layer 430, the top of the interdigital capacitor is above the at least one first metal layer 410 (that is, above a topmost first metal layer 410 in the at least one first metal layer 410), and the bottom of the interdigital capacitor is below the at least one first metal layer 410 (that is, below a bottommost first metal layer 410 in the at least one first metal layer 410). In a scenario in which the interdigital capacitor includes the second metal layer 420 but does not include the third metal layer 430, the top of the interdigital capacitor is above the second metal layer 420, and the bottom of the interdigital capacitor is below the at least one first metal layer 410 (that is, below a bottommost first metal layer 410 in the at least one first metal layer 410). In a scenario in which the interdigital capacitor includes the third metal layer 430 but does not include the second metal layer 420, the top of the interdigital capacitor is above the at least one first metal layer 410 (that is, above a topmost first metal layer 410 in the at least one first metal layer 410), and the bottom of the interdigital capacitor is below the third metal layer 430. In a scenario in which the interdigital capacitor includes the second metal layer 420 and the third metal layer 430, the top of the interdigital capacitor is above the second metal layer 420, and the bottom of the interdigital capacitor is below the third metal layer 430.

In an implementation, each fourth metal layer 440 may include one or more strip metals. To minimize impact of the strip metal on the interdigital capacitor, a length direction of the strip metal is perpendicular to a length direction of the first finger metal 412. Usually, the first finger metal 412, the second finger metal 414, and the third finger metal 415 in the first metal layer 410 are disposed in parallel. Therefore, that a length direction of the strip metal is perpendicular to a length direction of the first finger metal 412 also means that the length direction of the strip metal is perpendicular to both a length direction of the second finger metal 414 and a length direction of the third finger metal 415.

Figure 9:
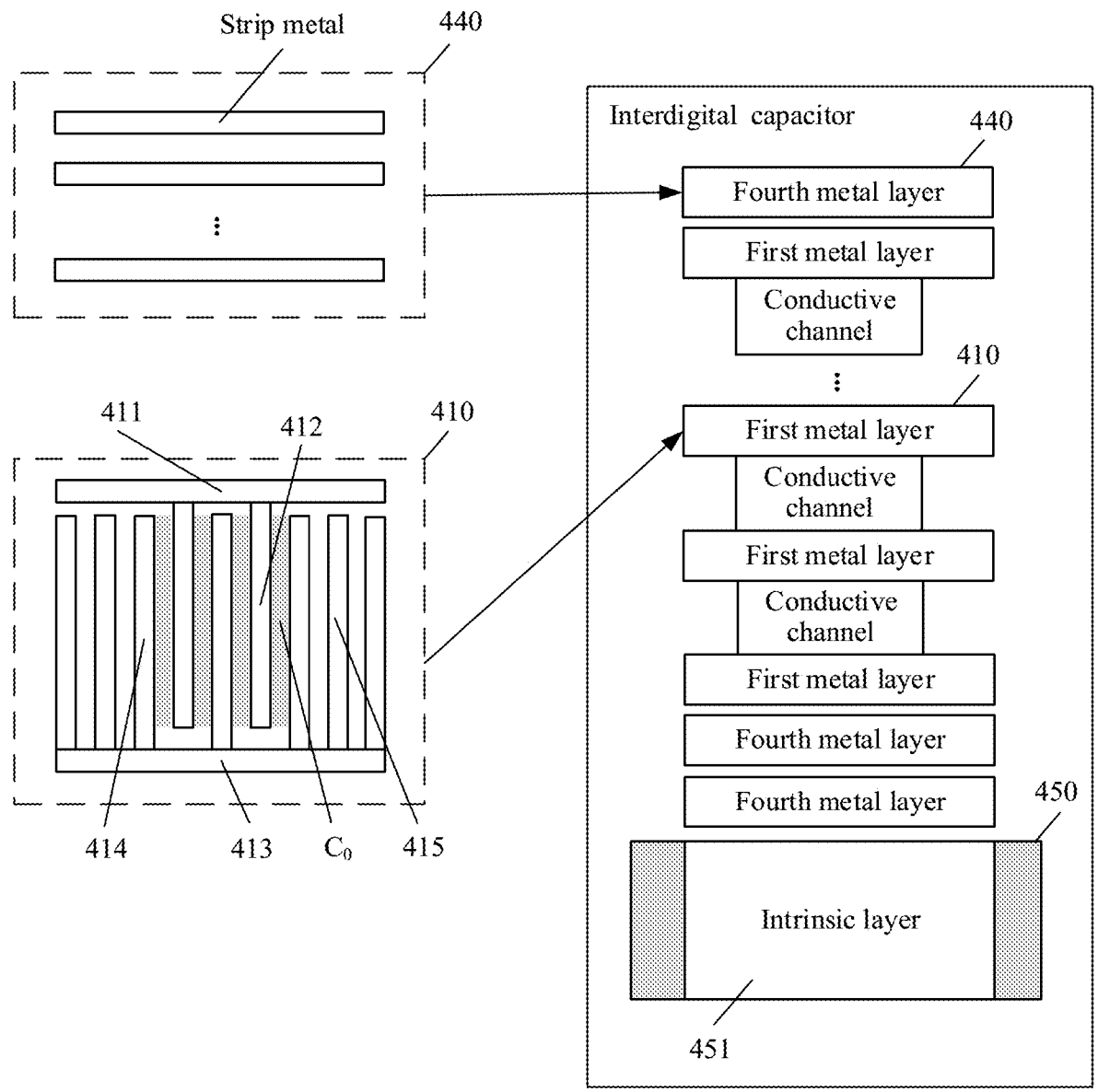
FIG. 9 is a schematic diagram 6 of a structure of an interdigital capacitor according to an embodiment of this application.

Further, as shown in FIG. 9, the interdigital capacitor provided in this embodiment of this application further includes a substrate 450, an intrinsic layer (for example, an NTN layer) 451 is disposed in the substrate 450, and the at least one first metal layer 410 is disposed on an upper surface of the intrinsic layer 451, to avoid interference caused by noise in the substrate 450 for the interdigital capacitor. The substrate 450 is usually made of a semiconductor material, such as single crystal, crystalline silicon, amorphous silicon, or silicon germanium (SiGe), or may be made of a hybrid semiconductor material, such as silicon carbide, indium antimonide, lead telluride, indium arsenide, indium phosphide, gallium arsenide, gallium antimonide, an alloy semiconductor, or a combination thereof. The intrinsic layer 451 is an undoped region.

According to the foregoing solutions, the interdigital capacitor provided in this embodiment of this application includes the first finger metal 412 and the second finger metal 414 that can form a capacitor, and the dummy finger metal (that is, the third finger metal), such that the capacitance value of the interdigital capacitor can be finely adjusted by adjusting parameters of the first finger metal 412 and the second finger metal 414, such as the length of the first finger metal 412, the length of the second finger metal, the quantity of first finger metals 412, and the quantity of second finger metals 414. Therefore, an interdigital capacitor with higher precision and a flexibly changed capacitance value can be provided compared with the conventional technology.

Figure 10:
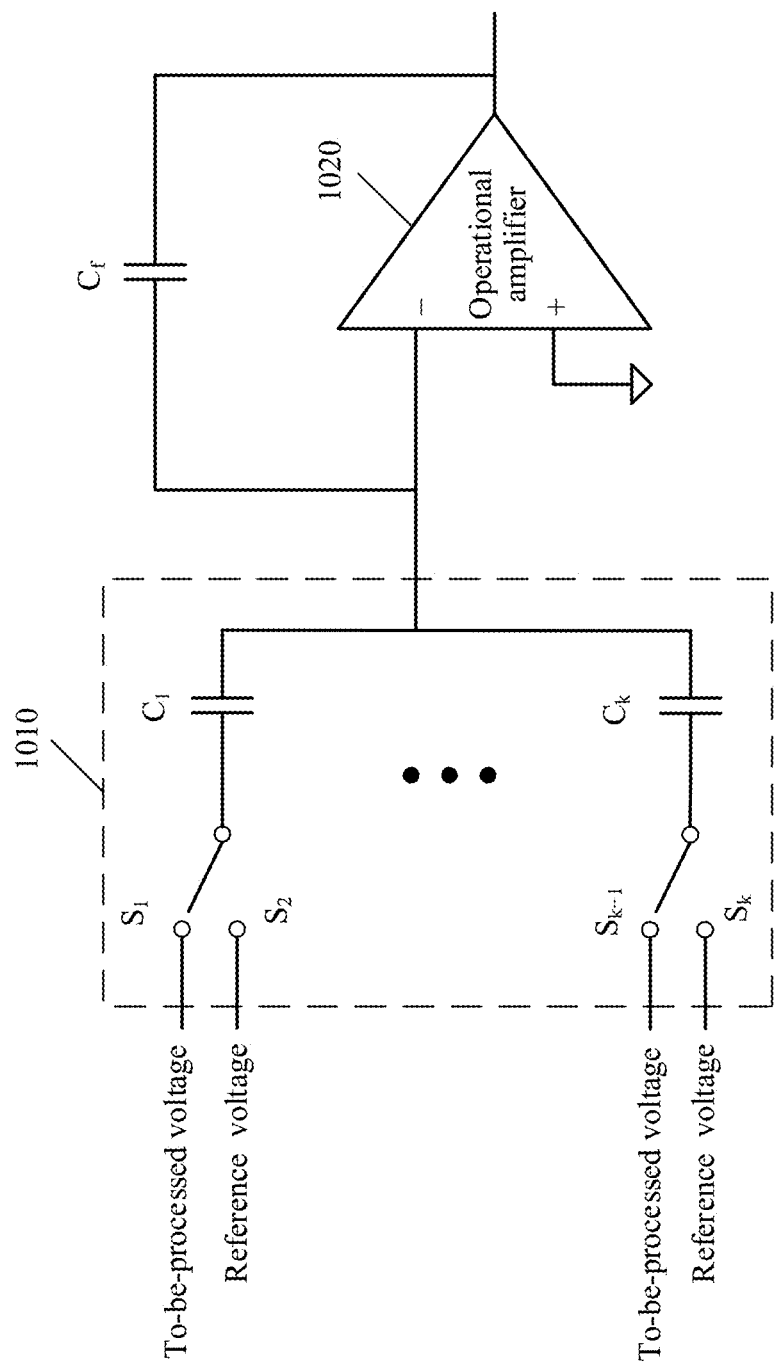
FIG. 10 is a schematic diagram of a structure of a multiplying digital-to-analog conversion circuit according to an embodiment of this application.

Based on the foregoing embodiment, this application further provides a multiplying digital-to-analog conversion circuit, and the multiplying digital-to-analog conversion circuit may be applied to a pipeline analog-to-digital converter. As shown in FIG. 10, the multiplying digital-to-analog conversion circuit includes a switched capacitor array 1010, a feedback capacitor $C_f$, and an operational amplifier 1020. The switched capacitor array 1010 includes k switches ($S_1, S_2, \ldots,$ and $S_k$) and k any-type interdigital capacitors ($C_1, C_2, \ldots,$ and $C_k$) according to the foregoing embodiment that are in a one-to-one correspondence with the k switches, where k is a positive integer. For any one of the k switches, a first terminal of the switch is configured to selectively output a to-be-processed voltage or a reference voltage to a first terminal of an interdigital capacitor corresponding to the switch, and a second terminal of the interdigital capacitor corresponding to the switch is separately coupled to a first input terminal of the operational amplifier 1020 and a first terminal of the feedback capacitor $C_f$. A second terminal of the operational amplifier 1020 is grounded, and a second terminal of the feedback capacitor $C_f$ is coupled to an output terminal of the operational amplifier 1020.

The switch in the switched capacitor array 1010 may be a controllable switch such as a metal-oxide semiconductor (MOS) or a transistor.

In an implementation, for any one of the k switches, the switch includes a first signal input terminal, a second signal input terminal, and a signal output terminal. The first signal input terminal is configured to input a to-be-processed voltage, the second signal input terminal is configured to input a reference voltage, and the signal output terminal is configured to selectively output the to-be-processed voltage or the reference voltage to a first terminal of an interdigital capacitor corresponding to the switch.

The switch is usually controlled, using a sample-and-hold signal, to selectively output the to-be-processed voltage or the reference voltage to the first terminal of the interdigital capacitor corresponding to the switch. In this case, the switch may further include a control terminal configured to input a sample-and-hold signal. For example, in a sampling phase, the switch is controlled, using a sample-and-hold signal, to conduct a path between the first signal input terminal and the signal output terminal and break a path between the second signal input terminal and the signal output terminal, to output a to-be-processed voltage to the first terminal of the interdigital capacitor corresponding to the switch. In a holding phase, the switch is controlled, using a sample-and-hold signal, to break the path between the first signal input terminal and the signal output terminal and conduct the path between the second signal input terminal and the signal output terminal, to output a reference voltage to the first terminal of the interdigital capacitor corresponding to the switch. The switch is two single-pole single-throw switches, one single-pole multi-throw switch (such as a single-pole double-throw switch), or the like.

Further, capacitance values of the k interdigital capacitors are respectively C, 2C, $2^2C, \ldots,$ and $2^{k-1}C$, where C is a constant. The k interdigital capacitors whose capacitance values are respectively C, 2C, $2^2C, \ldots,$ and $2^{k-1}C$ each may be implemented by adjusting one or more parameters such as a length of a first finger metal 412, a length of a second finger metal, a quantity of first finger metals 412, a quantity of second finger metals 414, and a distance between the first finger metal 412 and the second finger metal 414 in the interdigital capacitor.

Clearly, various modifications and variations to the embodiments of this application can be made without departing from the scope of the embodiments of this application. In this way, this application is intended to cover these modifications and variations of the embodiments of this application provided that they fall within the scope of protection defined by the following claims and their equivalent technologies.

What is claimed is:

1. An interdigital capacitor, comprising:
   at least one first metal layer;
   a first electrode disposed in the at least one first metal layer;
   at least one first finger metal disposed in the at least one first metal layer and electrically connected to the first electrode;

a second electrode disposed in the at least one first metal layer;
a plurality of second finger metals electrically connected to the second electrode; and
at least one third finger metal electrically connected to the second electrode,
wherein the at least one first finger metal is alternately disposed with the plurality of second finger metals to form capacitors, and
wherein the at least one third finger metal is a dummy finger metal.

2. The interdigital capacitor claim 1, wherein the at least one third finger metal is located on a same side of the plurality of second finger metals.

3. The interdigital capacitor of claim 1, wherein first finger metals in a plurality of first finger metals have different lengths when the at least one first metal layer comprises the plurality of first finger metals.

4. The interdigital capacitor of claim 1, wherein second finger metals in the plurality of second finger metals have different lengths.

5. The interdigital capacitor of claim 1, wherein a quantity of first finger metals, a quantity of second finger metals, an effective length of the first finger metal, and a distance between a first finger metal in the first finger metals and a second finger metal in the second finger metals that are adjacent to each other are set based on a capacitance value of a capacitor of the first metal layer, wherein the effective length of the first finger metal is a length of a part that is of the first finger metal and that can form a sidewall capacitor with a neighboring second finger metal, wherein the capacitance value of the capacitor of the first metal layer is positively correlated with the quantity of first finger metals, the quantity of second finger metals, and the effective length of the first finger metal, and wherein the capacitance value of the capacitor of the first metal layer is negatively correlated with the distance between the first finger metal and the second finger metal.

6. The interdigital capacitor of claim 1, further comprising:
a first conductive channel configured to connect first electrodes in two adjacent first metal layers in the at least one first metal layer; and
a second conductive channel configured to connect second electrodes in the two adjacent first metal layers.

7. The interdigital capacitor of claim 1, further comprising a second metal layer disposed above the at least one first metal layer, wherein the second metal layer is configured to shield the at least one first metal layer from interference caused by an external environment.

8. The interdigital capacitor of claim 7, wherein the second metal layer comprises:
a third electrode;
a plurality of fourth finger metals separately connected to the third electrode; and
a third conductive channel configured to electrically connect the third electrode to one of the first electrode or the second electrode in a first metal layer of the at least one first metal layer, wherein the first metal layer is adjacent to the second metal layer.

9. The interdigital capacitor of claim 1, further comprising a third metal layer disposed below the at least one first metal layer, wherein the third metal layer is configured to shield the at least one first metal layer from interference caused by an external environment.

10. The interdigital capacitor of claim 9, wherein the third metal layer comprises:

a fourth electrode;
a plurality of fifth finger metals separately connected to the fourth electrode; and
a fourth conductive channel configured to electrically connect the fourth electrode to one of the first electrode or the second electrode in a first metal layer of the at least one first metal layer, wherein the first metal layer is adjacent to the third metal layer.

11. The interdigital capacitor of claim 1, further comprising at least one fourth metal layer configured to perform metal density filling, wherein the at least one fourth metal layer is disposed such that:
the at least one fourth metal layer is disposed at a top surface of the interdigital capacitor;
the at least one fourth metal layer is disposed at a bottom surface of the interdigital capacitor; or
a part of the at least one fourth metal layer is disposed on top of the at least one first metal layer and another part of the at least one fourth metal layer is disposed below the at least one first metal layer.

12. The interdigital capacitor of claim 11, wherein each fourth metal layer comprises one or more strip metals.

13. The interdigital capacitor of claim 12, wherein a length direction of one of the strip metals is perpendicular to another length direction of the first finger metal.

14. The interdigital capacitor of claim 1, further comprising:
a substrate; and
an intrinsic layer disposed in the substrate, wherein the at least one first metal layer is disposed on an upper surface of the intrinsic layer.

15. The interdigital capacitor of claim 1, wherein a distance between two adjacent finger metals in the at least one first metal layer is greater than or equal to a first threshold, and wherein a width of each finger metal in the at least one first metal layer is greater than or equal to a second threshold.

16. The interdigital capacitor of claim 1, wherein the interdigital capacitor is a metal-oxide-metal (MOM) capacitor.

17. The interdigital capacitor of claim 16, wherein the MOM capacitor comprises a plurality of first metal layers stacked in parallel to each other.

18. The interdigital capacitor of claim 1, wherein third finger metals in a plurality of third finger metals are located on two sides of the plurality of second finger metals when the first metal layer comprises the plurality of third finger metals.

19. A multiplying digital-to-analog conversion circuit, comprising:
a switched capacitor array comprising k switches and k interdigital capacitors that are in a one-to-one correspondence with the k switches, wherein k is a positive integer, wherein for any switch in the k switches, the switch is configured to selectively output a to-be-processed voltage or a reference voltage to a first terminal of an interdigital capacitor in the k interdigital capacitors corresponding to the switch;
an operational amplifier comprising an input terminal coupled to a second terminal of the interdigital capacitor, wherein the operational amplifier further comprises an output terminal and a grounded terminal; and
a feedback capacitor comprising a first feedback terminal coupled to the output terminal and a second feedback terminal coupled to the second terminal,
wherein the interdigital capacitor comprises:
at least one first metal layer;

a first electrode disposed in the at least one first metal layer;

at least one first finger metal disposed in the at least one first metal layer and electrically connected to the first electrode;

a second electrode disposed in the at least one first metal layer;

a plurality of second finger metals electrically connected to the second electrode; and at least one third finger metal electrically connected to the second electrode, wherein the at least one first finger metal is alternately disposed with the plurality of second finger metals to form capacitors, and wherein the at least one third finger metal is a dummy finger metal.

20. The multiplying digital-to-analog conversion circuit of claim 19, wherein capacitance values of the k interdigital capacitors are respectively $C, 2C, 2^2C, \ldots,$ and $2^{k-1}C$, and wherein C is a constant.

* * * * *